US006782525B2

(12) United States Patent
Garza et al.

(10) Patent No.: US 6,782,525 B2
(45) Date of Patent: Aug. 24, 2004

(54) WAFER PROCESS CRITICAL DIMENSION, ALIGNMENT, AND REGISTRATION ANALYSIS SIMULATION TOOL

(75) Inventors: Mario Garza, Sunnyvale, CA (US);
Neal Callan, Lake Oswego, OR (US);
George Bailey, Welches, OR (US);
Travis Brist, Camas, WA (US); Paul Filseth, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/236,207

(22) Filed: Sep. 5, 2002

(65) Prior Publication Data

US 2004/0049760 A1 Mar. 11, 2004

(51) Int. Cl.[7] .............................. G06F 17/50; G06K 9/00
(52) U.S. Cl. ........................................ 716/19; 382/144
(58) Field of Search ................................. 382/145, 151, 382/149, 144, 129; 716/11, 19, 21; 703/5, 6; 700/97, 121; 438/16; 430/5, 30, 22, 395; 396/374; 356/521, 401, 243.5; 355/52; 351/212

(56) References Cited

U.S. PATENT DOCUMENTS

| | | | |
|---|---|---|---|
| 4,926,489 A | | 5/1990 | Danielson et al. |
| 5,705,301 A | | 1/1998 | Garza et al. |
| 5,710,954 A | * | 1/1998 | Inoue ........................... 396/374 |
| 5,801,954 A | * | 9/1998 | Le et al. ........................ 716/21 |
| 6,016,357 A | * | 1/2000 | Neary et al. ................. 382/144 |
| 6,078,738 A | | 6/2000 | Garza et al. |
| 6,081,659 A | | 6/2000 | Garza et al. |
| 6,171,731 B1 | * | 1/2001 | Medvedeva et al. ............ 430/5 |
| 6,263,299 B1 | * | 7/2001 | Aleshin et al. ................. 703/5 |
| 6,309,809 B1 | * | 10/2001 | Starikov et al. ............. 430/395 |
| 6,482,555 B2 | * | 11/2002 | Chen et al. ...................... 430/5 |
| 6,571,383 B1 | * | 5/2003 | Butt et al. ..................... 716/19 |
| 6,602,728 B1 | * | 8/2003 | Liebmann et al. ............. 438/16 |
| 2002/0019729 A1 | | 2/2002 | Chang et al. |
| 2002/0062206 A1 | * | 5/2002 | Liebchen ........................ 703/6 |

OTHER PUBLICATIONS

Weidong et al., " Alignment and overlay metrology using aspectroscopic diffraction method ", □□Mar. 31–Apr. 1, 2003 , Advanced Semiconductor Manufacturing Conference and Workshop, 2003 IEEE/SEMI , pp.:46.*

Pati et al., "Exploiting structure in fast aerial image computation for integrated circuit patterns", □□1 , Feb. 1997, Semiconductor Manufacturing, IEEE Transactions on , vol.: 10 Issue,□□pp.: 62–74.*

* cited by examiner

Primary Examiner—Leigh M. Garbowski
Assistant Examiner—Helen Rossoshek
(74) Attorney, Agent, or Firm—Sawyer Law Group, LLP

(57) ABSTRACT

An improved process simulation system for simulating results of fabrication process for a semiconductor device design is disclosed. According to the method and system disclosed herein, the process simulator receives processing parameters and mask data for at least two masks as input, and simulates results of the fabrication process such that an aerial image is generated for each layer of the device that was simulated. After generating the aerial images, the process simulator superimposes the aerial images to create a composite image. An operator is then allowed to misalign at least one of the images in relation to the other images based on one or more offset values. The composite image showing the misalignment is then displayed, allowing the operator to view nominal process capability as well as process fluctuations prior to fabrication of the semiconductor device.

20 Claims, 6 Drawing Sheets

WAFER PROCESS CRITICAL DIMENSION, ALIGNMENT, AND REGISTRATION ANALYSIS SIMULATION TOOL

FIELD OF THE INVENTION

The present invention relates to the field of semiconductor processing and more particularly to a process simulation method that allows a semiconductor device design to be evaluated for critical dimension and alignment/registration variations prior to fabrication.

BACKGROUND OF THE INVENTION

An integrated circuit is fabricated by translating a circuit design or layout to a semiconductor substrate. In optical lithography, the layout is first transferred onto a physical template, which is in turn, used to optically project the layout onto a silicon wafer. In transferring the layout to a physical template, a mask is generally created for each layer of the integrated circuit design. The patterned photomask includes transparent, attenuated phase shifted, phase shifted, and opaque areas for selectively exposing regions of the photoresist-coated wafer to an energy source. To fabricate a particular layer of the design, the corresponding mask is placed over the wafer and a stepper or scanner machine shines a light through the mask via the energy source. The end result is a semiconductor wafer coated with a photoresist layer having the desired pattern that defines the geometries, features, lines and shapes of that layer. The photolithography process is typically followed by an etch process during which the underlying substrate not covered or masked by the photoresist pattern is etched away, leaving the desired pattern in the substrate. This process is then repeated for each layer of the design.

Ideally, the photoresist pattern produced by the photolithography process and the substrate pattern produced by the subsequent etch process would precisely duplicate the pattern on the photomask. For a variety of reasons, however, the photoresist pattern remaining after the resist develop step may vary from the pattern of the photomask significantly. Diffraction effects and variations in the photolithography process parameters typically result in critical dimension (CD) variation from line to line depending upon the line pitch surrounding environment (where pitch is defined for purposes of this disclosure as the displacement between an adjacent pair of interconnect lines). In addition to CD variation, fringing effects and other process variations can result in end-of-line effects (in which the terminal end of an interconnect line in the pattern is shortened or cut off by the photolithography process) and corner rounding (in which square angles in the photomask translate into rounded corners in the pattern). These three primary optical proximity effects, together with other photoresist phenomena such as notching, combine to undesirably produce a patterned photoresist layer that may vary significantly from the pattern of the photomask. In addition to variations introduced during the photolithography process, further variations and distortions are typically introduced during the subsequent etch process such that the pattern produced in the semiconductor substrate may vary from the photomask pattern even more than the photoresist pattern.

Conventional semiconductor process engineering in the areas of photolithography and etch typically attempts to obtain a finished pattern that more closely approximates the desired pattern as closely as possible by controllably altering the process parameters associated with the various masking steps. Among the parameters process engineers typically attempt to vary in an effort to produce a photoresist pattern substantially identical to the photomask pattern include the intensity, coherency and wave length of the energy source, the type of photoresist, the temperature at which the photoresist is heated prior to exposure (pre-bake), the dose (intensity×time) of the exposing energy, the numerical aperture of the lens used in the optical aligner, the use of antireflective coatings, the develop time, developer concentration, developer temperature, developer agitation method, post bake temperature, and a variety of other parameters associated with the photolithography process. Etch parameters subject to variation may include, for example, process pressure and temperature, concentration and composition of the etch species, and the application of a radio frequency energy field within the etch chamber.

Despite their best efforts, however, semiconductor process engineers are typically unable to manipulate the photolithography and etch processes such that the photoresist and substrate patterns produced by the processes are substantially identical to the photomask pattern.

To avoid the time and cost of producing actual test wafers for every desired permutation of process parameters, computerized simulation of masking processes is employed to facilitate the optimization of a particular masking sequence and the generation of an optical proximity correction (OPC) distorted photomask. Masking process simulators receive various inputs corresponding to the parameters of the photoresist and etch processes to be simulated and attempt to simulate the pattern that will be produced by the specified masking process given a particular photomask. Accordingly, computerization has significantly enhanced the process engineer's ability to characterize and optimize masking processes.

Nevertheless, it is typically impossible to adequately account for the multitude of parameters associated with a masking process despite the effort devoted to masking process characterization, the introduction of optical proximity correction techniques, and the emergence of sophisticated process simulation software. For example, all stepper machines have critical dimension (CD) and alignment/registration tolerances. These tolerances indicate how much a printed feature may deviate from a mathematically perfect image. For instance, the specification for a particular scanner may specify that the tolerance for alignment and registration is ±30 nanometers, while the tolerance for the critical dimension (CD) or line width control is ±15 nanometers. In addition, these tolerances may be different for each layer of the semiconductor device.

Alignment/registration and CD errors in a device become significant because errors on different layers compound each other. For example, assume that the scanner tolerances for a particular contact layer states that contacts can be misaligned by ±25 nanometers. If for example, the contact layer is misaligned by 25 nanometers to the left when the device is made, and the feature that the contact is to overlap with on an adjacent layer is misaligned to the right by the same amount, the contact may fail to overlap with that feature. To allow for this variation, the device designer may have to design the contact 50 nanometers larger to ensure the contacts will always overlap with the other feature when the device is made, thus decreasing packing density of the device.

Although conventional simulation programs are capable of simulating the result of different layers in the device, such programs are incapable of allowing the device designer to easily evaluate all the possible process variations that may occur due to CD and alignment/registration errors, and the effects of those variations on adjacent layers of the device.

Accordingly, what is needed is a method and system for improving the simulation software to allow a multi-layer semiconductor device design to be evaluated for critical dimension and alignment/registration variations without having to actually fabricate the semiconductor. The present invention addresses such a need.

SUMMARY OF THE INVENTION

The present invention provides an improved process simulation system for simulating results of fabrication process for a semiconductor device design. According to the method and system disclosed herein, the process simulator receives processing parameters and mask data for at least two masks as input, and simulates results of the fabrication process such that an aerial image is generated for each layer of the device that was simulated. After the simulation, the process simulator superimposes the aerial images to create a composite image, and displays the composite image to an operator. The operator is then allowed to misalign at least one of the images in relation to the other images based on one or more offset values.

According to the method and system disclosed herein, the process simulator allows the operator or device designer to predict with a high degree of accuracy the nominal capability of the fabrication process and also investigate normal process fluctuations occurring in scanner alignment/registration and critical dimension control. The present invention may further be used at the mask level to see the effects of inherent mask misalignment issues and their effects on the chip making process.

DETAILED DESCRIPTION OF THE INVENTION

The present invention relates to simulating semiconductor devices and evaluating CD and alignment/registration errors prior to fabrication. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
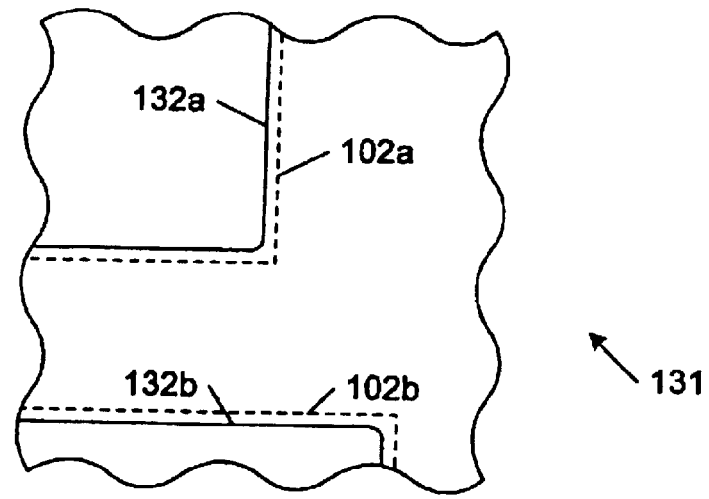
FIG. 1 is a partial top view of a desired pattern to be produced by a semiconductor masking process showing discrepancies between an actual pattern and a desired pattern.

Referring now to FIG. 1 a portion of a desired semiconductor pattern and the patterned layer resulting from the masking process is shown. The semiconductor pattern shown in dashed lines includes various pattern elements 102a, and 102b (collectively referred to as pattern elements 102). Using the pattern, a masking process is used to create the patterned layer 131, comprising the actual elements 132. The patterned layer 131 may comprise, in alternative embodiments, a photoresist pattern produced by a photolithography process or a substrate pattern produced by an etch process.

As will be appreciated to those skilled in the art of semiconductor processing and design, elements 102 of semiconductor pattern includes various interconnect sections and pattern elements designed to achieve a desired function when the integrated circuit contemplated by the semiconductor fabrication process is completed. Typical elements 102 of a semiconductor pattern are substantially comprised of straight lines and square corners. For a variety of reasons, reproducing the exact image of semiconductor pattern in a production process is extremely complicated due to the large number of parameters associated with typical masking processes and further due to the unavoidable diffraction effects which inevitably result in some variations between the photomask used to produce a pattern and the pattern itself.

It is seen in FIG. 1 that the actual pattern 131 produced by a masking process varies from the desired semiconductor pattern 102. This discrepancy is shown in FIG. 1 as the displacement between the dashed lines of pattern elements 102a and 102b and the actual pattern elements 132a and 132b. Typically, the variations from the idealized pattern 102 include rounding of the corners and a shrinking of the line widths. It will be appreciated to those skilled in the art of semiconductor processing that variations from the desired semiconductor pattern can contribute to lower processing yields, reduced reliability, reduced tolerance to subsequent misalignment, and other undesired effects.

As is well-known in the art, commercial process simulation software is available that is capable of producing a simulated estimate of the pattern that would be produced by a specified masking process using a given photomask. Examples of process simulation software include TSUPREM-4™ and Taurus-LRC™ by Synopsys, Inc. of Mountain View, Calif. Masking process simulators are useful for generating a large quantity of information concerning the effects of modifying various parameters associated with the process. Simulation is necessary to avoid the time and expense associated with producing actual test wafers for each proposed parameter modification. However, conventional process simulators are incapable of simulating variations that can occur among vertical layers in the device due to stepper CD and alignment/registration fluctuations and errors.

The present invention provides an improved process simulation system for simulating results of a fabrication process for a semiconductor device design. The process simulator of the present invention receives processing parameters and mask data for at least two masks as input, and simulates results of the fabrication process such that an aerial image is generated for each layer of the device that was simulated. After generating the aerial images, the process simulator superimposes the aerial images to create a composite image. An operator is then allowed to misalign at least one of the images in relation to the other images by inputting on or more offset values. The composite image showing the misalignment is then displayed, thereby allowing the operator to view nominal process capability as well as process fluctuations prior to fabrication of the semiconductor device.

Figure 2:
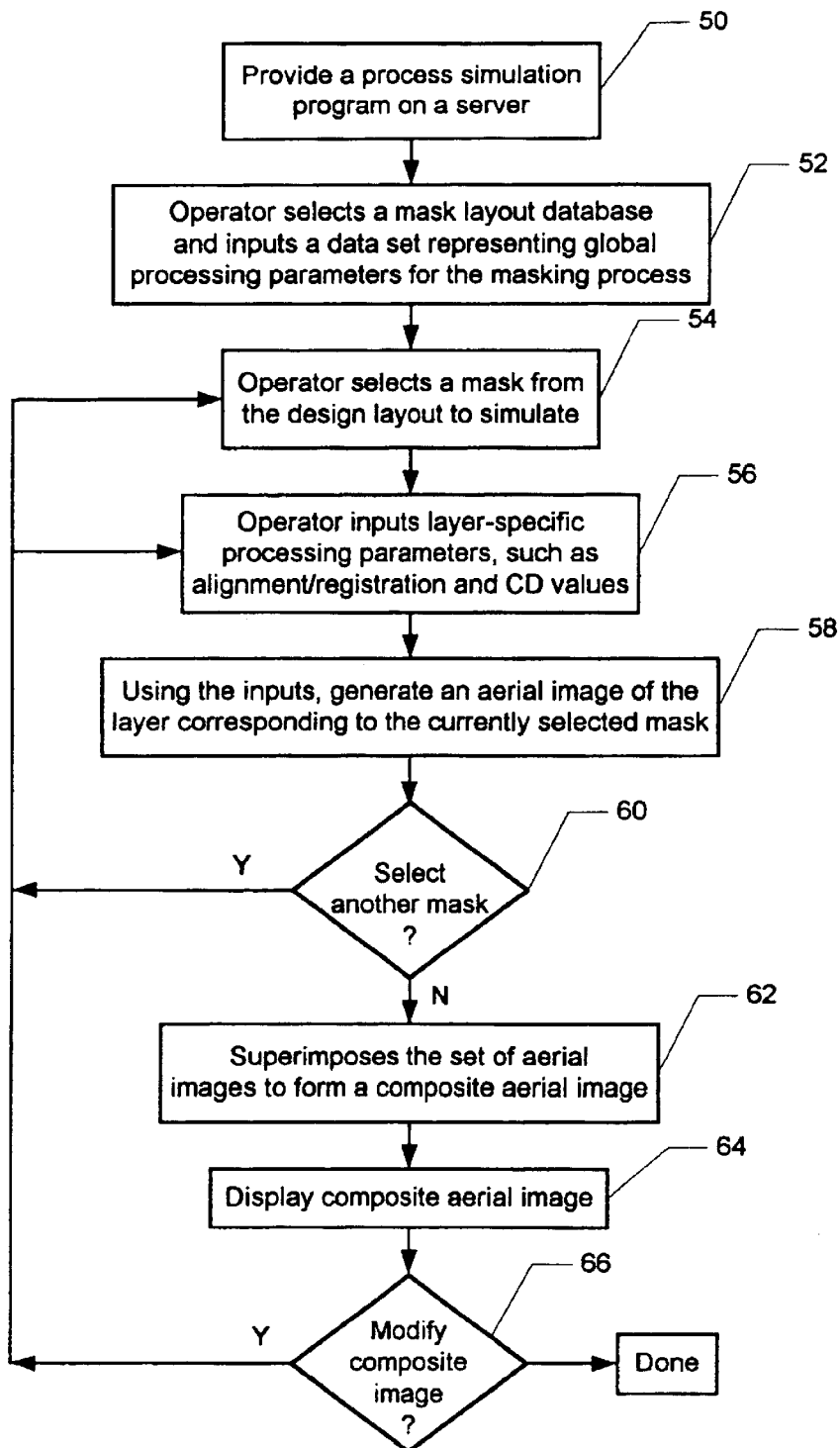
FIG. 2 is a flow chart illustrating a process for evaluating a multi-layer semiconductor device design in view of a fabrication process prior to device manufacture in accordance with a preferred embodiment of the present invention.

FIG. 2 is a flow chart illustrating a process for evaluating a multi-layer semiconductor device design in view of a fabrication process prior to device manufacture in accordance with a preferred embodiment of the present invention. The process begins in step 50 by providing a process simulation program that operates in accordance with the present invention on a server, and making the program available over a network, such as the Internet.

Figure 3:
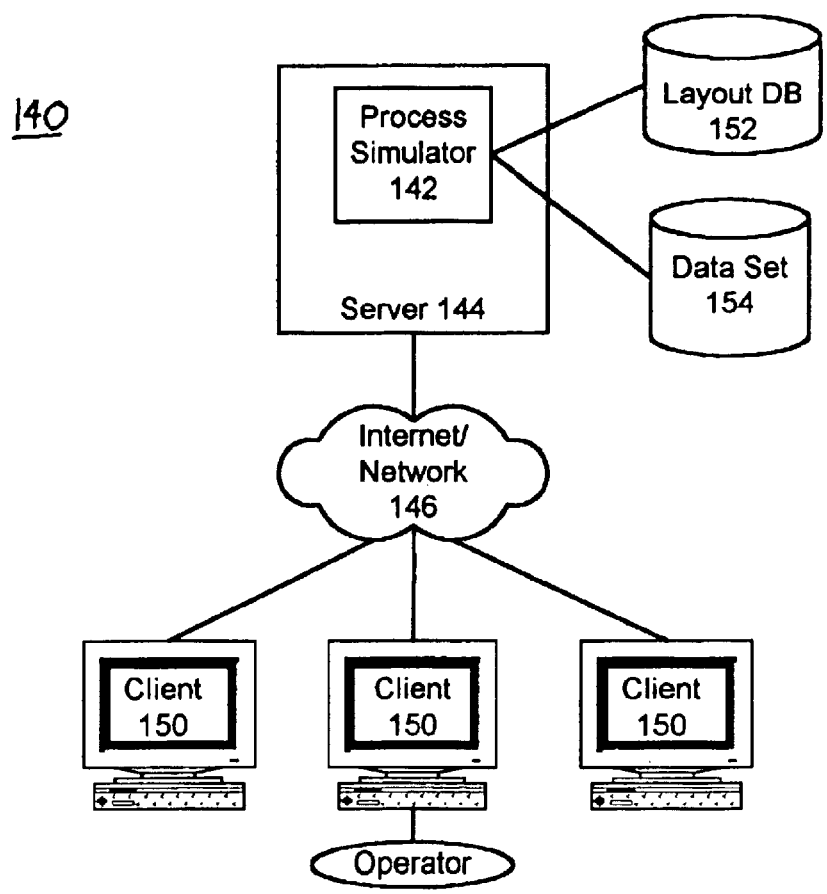
FIG. 3 is a block diagram of a web-enabled process simulation system in a preferred embodiment of the present invention.

FIG. 3 is a block diagram of a web-enabled process simulation system in a preferred embodiment of the present invention. The simulation system 140 includes a process simulator 142 that is executed on a server 144 as an application program and accessed over a network 146 by one or more operators using client computers 150. The process simulator 142 has access to one or more mask layout databases 152, each of which includes a set of mask designs that will be used to fabricate a particular semiconductor device. Typically, there is a separate mask for each processing layer in the device. The process simulation 140 also includes a data set 154, which is used as input as described below.

Referring again to FIG. 2, after the process simulator 142 is invoked from a client computer 150, the operator in step 52 selects one of the available mask layout databases 152 for simulation, and inputs a data set 154 representing global processing parameters of the masking process. Each element of the data set 154 corresponds to a parameter associated with the masking process to be simulated and which will eventually be used to actually fabricate the semiconductor device. The parameters that may be associated with simulator 142 will be discussed in greater detail below in conjunction with FIGS. 5A–5C.

After inputting the global parameters, the operator in step 54 selects a particular mask from the design layout 152 for simulation. Typically, the operator will select a mask corresponding to a critical layer in the design, such as an isolation layer, a polysilicon layer, or a contact layer, for example.

According to the present invention, the operator in step 56 may also input layer-specific processing parameters relating to alignment/registration and the critical dimension that will only be used to simulate the current mask/layer. These layer-specific parameters may include for example, alignment offsets based on scanner/process specifications, and critical dimensions/focus variations that change feature sizes. From the individual layer alignment offsets, a global alignment scenario for the entire process can be obtained. In addition, the layer-specific parameters may also include rotation values, so that an entire layer may be rotated in relation to the other layers. In a preferred embodiment, the rotation values are entered in radians, and the point of rotation may be set as at the center or corner of the layer.

In response to the input information, the process simulator 142 in step 58 generates an aerial image of the simulated layer corresponding to the currently selected mask. An aerial image refers to the simulator's estimation of the pattern that would be produced using the patterned mask with the masking process being simulated under conditions specified by the data set 154 and layer-specific parameters. In the embodiment shown in FIG. 2, the simulator 142 includes computer instructions designed to generate the aerial image from the input information. The server 144 further includes a storage device for storing the aerial images. Alternatively, the aerial images may be stored on the client computer 150.

In step 60, it is determined if the operator wishes to select another mask. If so, the process continues with steps 54–58 until all the selected masks have been simulated. Alternatively, the operator may modify the layer-specific parameters for the current mask in step 56.

After the operator finishes in step 60 and the last aerial image is generated, the process simulator 142 superimposes the set of aerial images to form a composite aerial image in step 62. In step 64, the composite aerial image is output to the operator, preferably by displaying it on the client computer 150, although a hard copy could also be provided.

Figure 4A:
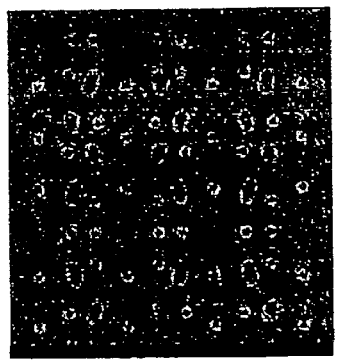
FIGS. 4A and 4B are diagrams illustrating example composite aerial images generated in accordance with the present invention.
Figure 4B:
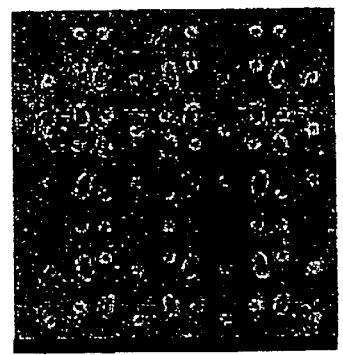

FIGS. 4A and 4B are diagrams illustrating example composite aerial images generated in accordance with the present invention. In this example, the composite images are generated from three aerial images corresponding to the isolation layer, the polysilicon layer, and the contact layer of a particular design. Different alignment and critical dimension values were used in FIGS. 4A and 4B. FIG. 4A shows the three layers in alignment, while FIG. 4B shows the result of having the contact layer misaligned from the isolation and polysilicon layers.

Referring again to FIG. 2, after displaying the composite image, it is determined whether the operator wishes to modify the composite image in step 66. If so, the operator may select a new or previously selected mask in step 54, and/or enter new alignment and critical dimension values for the current mask in step 56. Using these new inputs, the process simulator 142 generates new aerial images for the corresponding layers via step 58, which modifies the composite image displayed to the user via steps 62 and 64.

According to the present invention, the process simulation system 141 allows the operator to iteratively change layer-specific alignment and critical dimension values, which enables process capability testing for corner and center areas of each layer under varying conditions. The advantage is that a chip designer may predict with a high degree of accuracy the nominal process capability and also investigate normal process fluctuations on alignment/registration of scanners and critical dimension control. The present invention further may be used at the mask level to see the effects of inherent mask misalignment issues and their effects on the chip making process.

Figure 5A:
FIGS. 5A, 5B and 5C are a sequence of partial cross-sectional views of a semiconductor wafer upon which a patterned photoresist layer is formed.
Figure 5B:
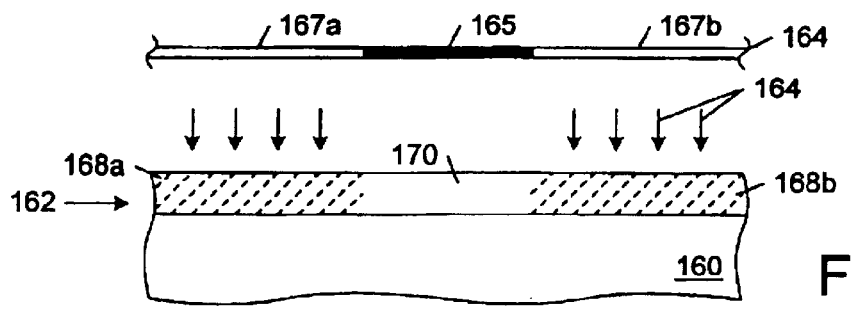
Figure 5C:
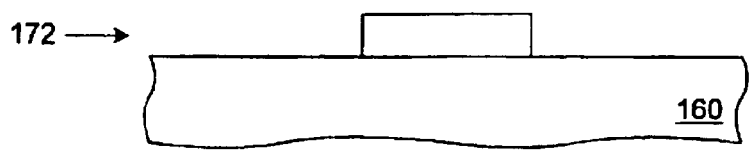
Figure 6:
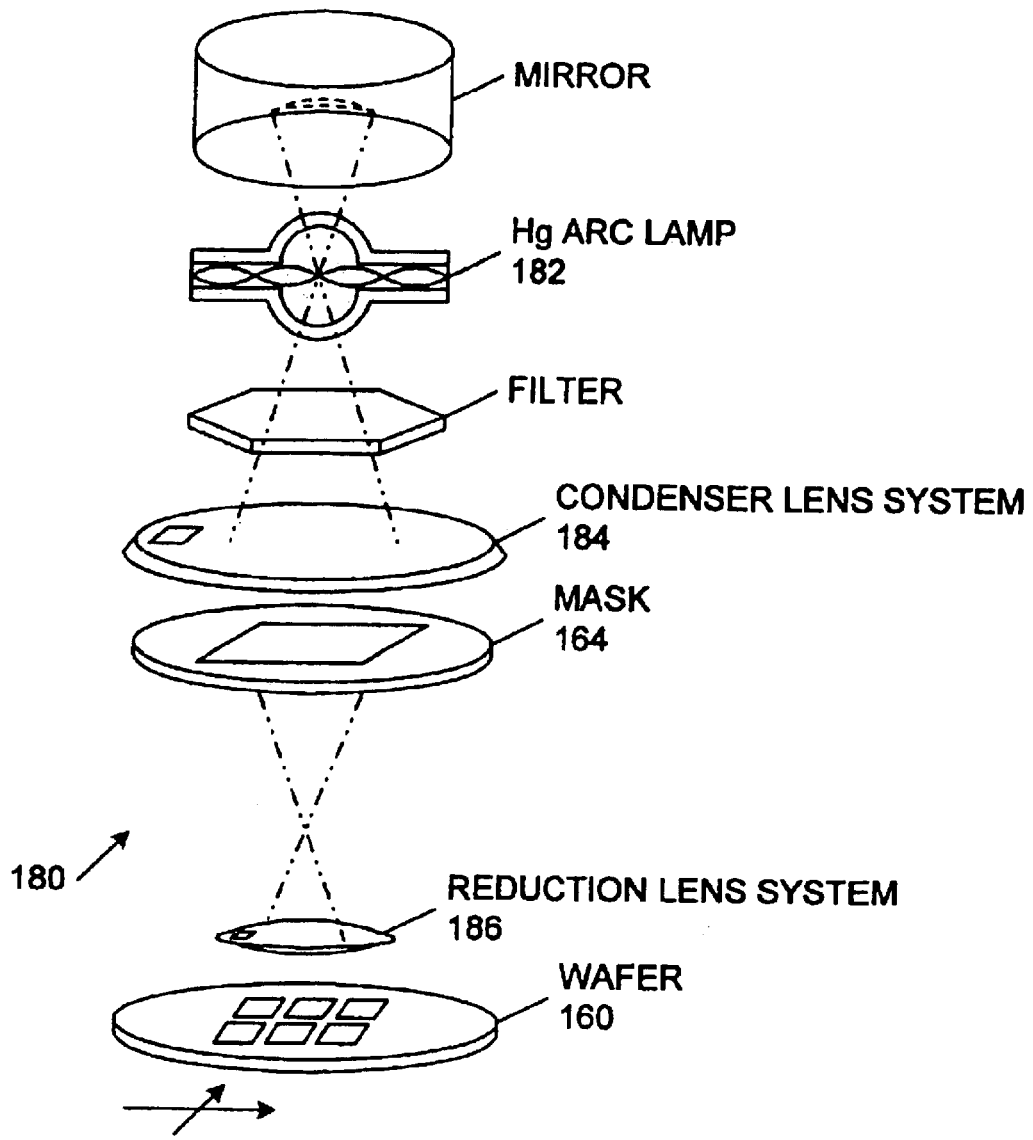
FIG. 6 an exploded view of selected elements of an optical aligner.

Referring now to FIGS. 5 and 6, a typical photoresist process and optical aligner are depicted to illustrate the variety of parameters that may be incorporated into simulator 142. FIG. 5A is a partial cross-sectional view of a semiconductor substrate 160 upon which a photoresist layer 162 has been deposited. Semiconductor substrate 160 typically includes a single crystal silicon bulk upon which one or more semiconductor process layers have been fabricated. The material upon which photoresist layer 162 is deposited may include, among others, silicon, a dielectric such as silicon-oxide, a metal such as aluminum or an aluminum alloy, silicon nitride, and a variety of other materials typically associated with semiconductor processing. Spin deposition techniques are well known in the field of semiconductor processing. After deposition of the photoresist layer 162, a typical pr process includes a soft bake during which the photoresist layer is heated to improve the adhesion between the photoresist layer and the semiconductor substrate and to drive off a liquid portion of the photoresist. The soft bake or pre-bake process may be varied according to different temperatures and durations to achieve various resist consistencies prior to exposure. FIG. 5B shows a simplified view of an exposure process during which optical energy 166 is directed at photoresist layer 162 through photomask 164 to selectively expose regions 168a and 168b of photoresist layer 162.

As seen in FIG. 5B, photomask 164 includes opaque region 165 and transparent regions 167a and 167b. The opaque regions and transparent regions of photomask 164 result in unexposed portions 170 and exposed portions 168 of photoresist layer 162 when optical energy 166 is directed at semiconductor substrate 160 in the presence of photomask 164. As is well known, the solubility of exposed portions 168 in a developer solution is either less than or greater than a solubility of unexposed portion 170 in the developer solution depending upon the type of photoresist.

The exposure process shown in FIG. 5B comprises a number of parameters that may be accommodated by the simulator 142. The exposure, duration and intensity of optical energy 166 coupled with the coherency and wavelength of the impinging energy may be suitably incorporated into simulator 142. In addition, the photoresist itself can have a significant impact on the resulting profile. As is well known to those skilled in the field of photolithography engineering, resist contrast (.gamma.), resist thickness, resist sensitivity, resist solids content, and resist viscosity can all affect the resulting profile and may all be incorporated into the simulator.

Turning to FIG. 5C, a subsequent processing step is shown in which exposed portions 168 of photoresist layer 162 have been removed with a develop process to produce a pattern 172 upon semiconductor substrate 160. It will be further appreciated to those skilled in the art that the developer process and the etch process (not shown in the drawing) both include a number of parameters potentially available to the simulation routine. Develop time, developer concentration, developer temperature, developer agitation method, and any post bake time and temperature may affect the resulting profile accordingly. Etch parameters may include, as examples, etch temperature, etch pressure, and etchant composition and concentration. The process parameters mentioned in the preceding discussion are meant to be illustrative rather than exhaustive and additional parameters may be incorporated into the simulator 142.

Referring now to FIG. 6, key components of an optical aligner 180 or stepper are shown including a mercury arc lamp 182, a first lens 184, and, in a reduction lens system, a reduction lens 186. Energy from mercury lamp 182 is directed toward mask 164 through lens 184 and onto semiconductor substrate 160 through reduction lens 186. As noted previously, the resist image obtained may be effected by the intensity of mercury lamp 182, the duration of the exposure, the coherency of the optical energy, the numerical aperture of lens 184 and 186, and the wavelength of the mercury lamp source. The parameters associated with optical aligner 180, may, like the parameters associated with the other features of the masking process, be incorporated into simulator 142.

It is theorized that, ultimately, the simulator will produce an estimate of the pattern (the aerial image) that varies from the actual pattern produced by the masking process regardless of the number of parameters incorporated into simulator 142. Accordingly, in a further aspect of the present invention, a feedback mechanism is introduced into the simulation process whereby the discrepancies observed between the actual pattern and the aerial image are analyzed to produce a modified simulator that results in less discrepancy or error between the aerial image produced during a successive iteration of the simulator and the actual image produced by the pattern.

Figure 7:
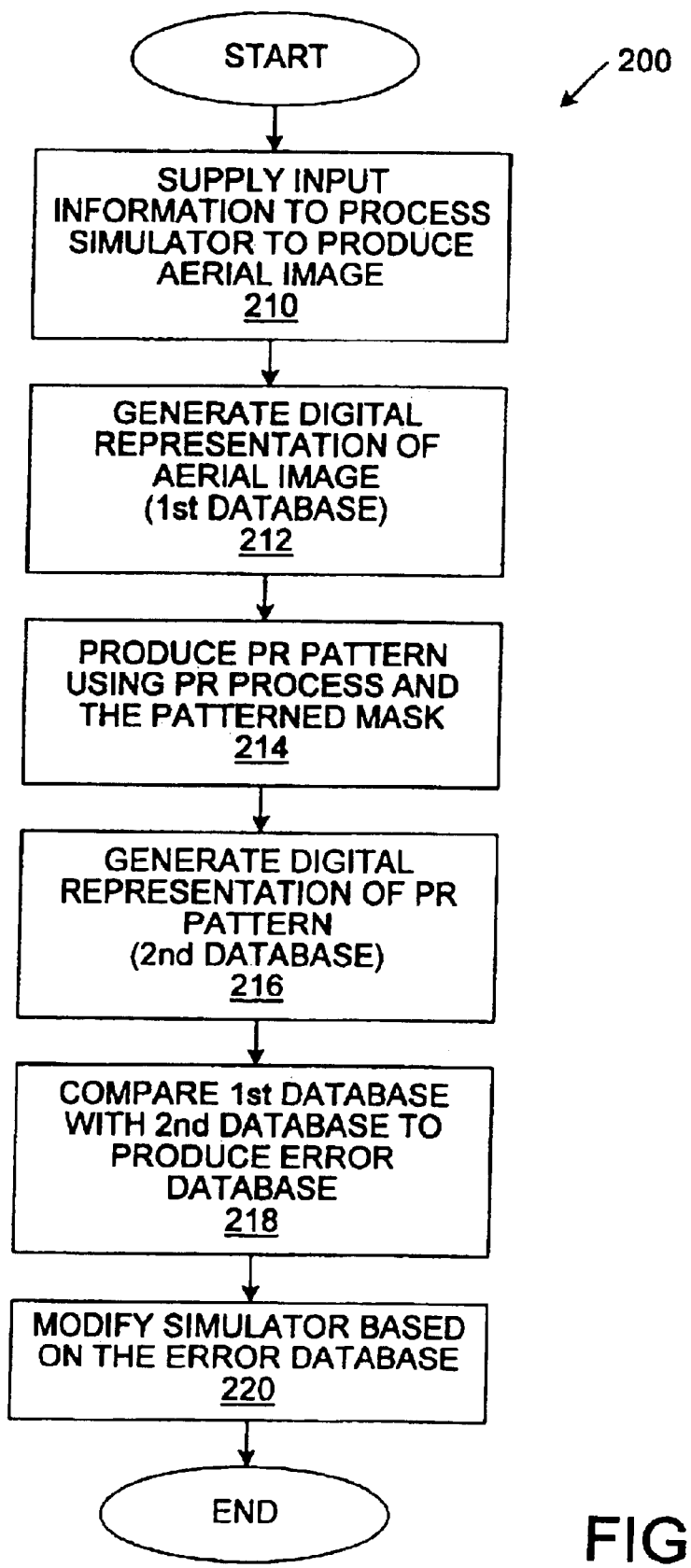
FIG. 7 is a flow diagram of a method for improving the simulation of a masking process.

Referring now to FIG. 7, a process flow 200 is shown for calibrating the process simulator. Process 200 contemplates a first step 210 during which input information is supplied to process simulator 142 to produce an aerial image. The input information, as discussed previously, includes a data set corresponding to the various parameters of a simulated masking process and a digital representation of a patterned mask. After the aerial image has been produced, a digital representation of the aerial image is generated as indicated in step 212 of FIG. 7. For purposes of this disclosure, the digital representation of the aerial image is referred to herein as the first data base. In process step 214, a pattern is produced using the masking process being simulated by simulator 142 in process step 210 under the conditions specified by the data set which is input to simulator 142. Thereafter, a digital representation of the pattern is generated in process step 216. In a presently preferred embodiment, the generation of a digital representation of the actual pattern is facilitated with a scanning electron microscope. A scanning electron microscope (SEM) image of the pattern is produced according to techniques well known in the semiconductor processing field. Thereafter, the SEM image is digitized to produce a second data base. In one presently preferred embodiment, the aerial image and the pattern 172 may include corresponding alignment marks to facilitate a subsequent comparison of the pattern 172 and the aerial image. In process step 218, the first data base is compared with the second data base to produce an error data base. The error data base is a digital representation of variations and discrepancies between the aerial image and pattern 172 produced by the actual masking process. This error data base gives invaluable insight into the deficiencies of the simulation model. The variations between the aerial image and the pattern photoresist layer reflect parametric effects and interdependencies of the masking process that are difficult if not impossible to anticipate a priori. Empirically obtained data, on the other hand, gives immediate and accurate feedback into modifications that are required to be made in the simulation routine to more accurately reflect the intricacies of the masking process. It is contemplated that a statistician, a mathematician, or other skilled person knowledgeable in the field of process simulation and familiar with the photoresist simulation routine employed by simulator 142 will be able to beneficially modify simulator 142 with the assistance of a skilled software engineer based on the information contained in the error data base to produce a modified simulation routine which more accurately predicts and simulates the pattern such that a subsequently executed iteration of simulator 142 produces a modified aerial image that more accurately approximates pattern 172 than the original aerial image.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for simulating results of fabrication process for a semiconductor device design using a software process simulator executing on a computer that generates aerial images, comprising the steps:
   (a) receiving processing parameters and mask data for at least two masks as input, and simulating results of the fabrication process such that an aerial image is generated for each layer of the device that was simulated;
   (b) superimposing the aerial images to create a composite image;
   (c) allowing an operator to misalign at least one of the images in relation to the other images by inputting at least one offset value; and
   (d) outputting the composite image showing the misalignment, thereby allowing the operator to view nominal process capability as well as process fluctuations prior to fabrication of the semiconductor device.

2. The method of claim 1 wherein step (c) further includes the step of: allowing the operator to have the at least one image moved vertically in relation to the other images.

3. The method of claim 2 wherein step (c) further includes the step of: allowing the operator to have the at least one image moved horizontally in relation to the other images.

4. The method of claim 3 wherein step (c) further includes the step of: allowing the operator to have the at least one image rotated in relation to the other images.

5. The method of claim 4 wherein step (c) further includes the step of: including registration and alignment values as the offset values.

6. The method of claim 5 wherein step (c) further includes the step of: including critical dimension values as the offset values, thereby allowing the operator to change feature sizes in the simulated layers.

7. The method of claim 6 further including the step of: providing the process simulator on a server and allowing the operator to access the process simulator from a client computer coupled to the server over a network.

8. A process simulator system, comprising:
   a server coupled to a network;
   a process simulator executing on the server; and
   at least one client computer coupled to the server over the network, such that an operator may access the process simulator, wherein once invoked, the process simulator:
   receives processing parameters and mask data for at least two masks as input, and simulates results of a particular fabrication process such that an aerial image is generated for each layer of the device that was simulated;
   superimposes the aerial images to create a composite image;
   allows an operator to misalign at least one of the images in relation to the other images by inputting at least one offset value; and
   outputs the composite image showing the misalignment, thereby allowing the operator to view nominal process capability as well as process fluctuations prior to fabrication of the semiconductor device.

9. The system of claim 8 further including a mask layout database accessible by the server that includes mask data for a set of mask designs that will be used to fabricate the particular semiconductor device.

10. The system of claim 9 wherein the process simulator further allows the operator to have the at least one image moved vertically in relation to the other images.

11. The system of claim 10 wherein process simulator further allows the operator to have the at least one image moved horizontally in relation to the other images.

12. The system of claim 11 wherein process simulator further allows the operator to have the at least one image rotated in relation to the other images.

13. The system of claim 12 wherein registration and alignment values are included as the offset values.

14. The system of claim 13 wherein critical dimension values are included as the offset values, thereby allowing the operator to change feature sizes in the simulated layers.

15. A method for evaluating a multi-layer semiconductor device design using a software process simulator that generates aerial images, where the device is to be fabricated using a photolithographic process, the method comprising the steps:
   (a) receiving mask data and parameters of the photolithographic process as inputs;
   (b) simulating results of the photolithographic for at least two of the layers of the device using the inputs to produce first and second aerial images;
   (c) superimposing the first and second layers and displaying a superimposed image to an operator;
   (d) allowing the operator to enter alignment offsets for at least one of the two layers based on process specifications; and
   (e) repeating steps (b) and (c) using the offsets as inputs, wherein the superimposed image is displayed with the first and second aerial images in misalignment, thereby allowing the operator to predict an outcome of the fabrication process without having to fabricate the device.

16. The method of claim 15 wherein step (d) further includes the step of: allowing the operator to enter a critical dimension value for at least one of the two layers and using the critical dimension value as an input to step (b).

17. The method of claim 16 wherein step (d) further includes the step of: allowing the operator to enter a rotation value for at least one of the two layers and using the critical dimension value as an input to step (b).

18. The method of claim 17 further including the step of: performing the method using a process simulator executing on a server, and allowing the operator to access the process simulator from a client computer coupled to the server over a network.

19. A method for simulating results of fabrication process for a semiconductor device design using a software process simulator executing on a computer that generates aerial images, comprising the steps:
   (a) receiving processing parameters and mask data for at least two masks as input, and simulating results of the fabrication process such that an aerial image is generated for each layer of the device that was simulated;
   (b) superimposing the aerial images to create a composite image;
   (c) allowing an operator to change a critical dimension value by inputting at least one offset value; and
   (d) outputting the composite image showing new feature sizes resulting from the critical dimension value, thereby allowing the operator to view nominal process capability as well as process fluctuations prior to fabrication of the semiconductor device.

20. The method of claim 19 further including the step of: allowing the operator to iteratively change layer-specific alignment and critical dimension values, thereby enabling process capability testing for corner and center area of each layer under varying conditions.

* * * * *